US012812889B2

(12) United States Patent
Li et al.

(10) Patent No.: US 12,812,889 B2
(45) Date of Patent: Nov. 24, 2026

(54) SEMICONDUCTOR DEVICES AND METHODS OF FABRICATION THEREOF

(71) Applicant: TAIWAN SEMICONDUCTOR MANUFACTURING COMPANY, LTD., Hsinchu (TW)

(72) Inventors: Shang-Rong Li, Hsinchu (TW); Chih-Wei Lee, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 345 days.

(21) Appl. No.: 18/524,644

(22) Filed: Nov. 30, 2023

(65) Prior Publication Data

US 2025/0185268 A1 Jun. 5, 2025

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10P 32/20*** | (2026.01) |

(52) U.S. Cl.

CPC ........... *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/01332* (2026.01); *H10P 32/20* (2026.01)

(58) Field of Classification Search

CPC .. H10D 30/014; H10D 30/43; H10D 30/6735; H10D 30/6757; H10D 62/121; H10D 64/01; H10D 64/01332; H10D 62/822; H10D 64/0134; H10D 64/017; H10D 64/667; H10D 64/685; H10P 32/20; H10P 95/00

See application file for complete search history.

(56) References Cited

U.S. PATENT DOCUMENTS

| | | | | |
|---|---|---|---|---|
| 8,900,886 | B2 | 12/2014 | Chen et al. | |
| 11,004,959 | B2 | 5/2021 | Ching et al. | |
| 11,081,584 | B2 * | 8/2021 | Savant | H10D 30/62 |
| 11,264,478 | B2 | 3/2022 | More et al. | |
| 11,594,614 | B2 * | 2/2023 | Yu | H10D 30/014 |
| 11,710,667 | B2 * | 7/2023 | Hsu | H10D 30/014 257/295 |

(Continued)

FOREIGN PATENT DOCUMENTS

| | | | |
|---|---|---|---|
| TW | 442959 | B | 6/2001 |
| TW | 201824555 | A | 7/2018 |

(Continued)

*Primary Examiner* — Mohammed Shamsuzzaman

(74) *Attorney, Agent, or Firm* — NZ Carr Law Office

(57) ABSTRACT

Semiconductor devices and fabrication methods are disclosed. An interfacial layer is deposited on a semiconductor channel region, followed by a high-K dielectric layer. The high-K dielectric layer is treated to incorporate a filler element, such as fluorine, to fill vacancies. A gate electrode layer is then deposited on the high-K dielectric layer. This treatment improves threshold voltage control and device performance, particularly for n-type field-effect transistors with aluminum in the work function metal layer, and is beneficial for static random-access memory cells.

20 Claims, 13 Drawing Sheets

(56) References Cited

U.S. PATENT DOCUMENTS

| | | | | |
|---|---|---|---|---|
| 2018/0145149 | A1* | 5/2018 | Chiang | H10D 30/60 |
| 2020/0098641 | A1 | 3/2020 | Chen et al. | |
| 2022/0344355 | A1* | 10/2022 | Lin | H01L 21/0228 |
| 2023/0009485 | A1* | 1/2023 | Lee | H10D 30/014 |
| 2023/0014998 | A1* | 1/2023 | Ju | H10D 30/014 |
| 2023/0061018 | A1* | 3/2023 | Lee | H01L 21/02238 |
| 2023/0065195 | A1* | 3/2023 | Hung | H10D 30/6735 |
| 2023/0066477 | A1* | 3/2023 | Lee | H10D 64/667 |
| 2023/0067988 | A1* | 3/2023 | Lin | H10D 64/017 |
| 2023/0268231 | A1 | 8/2023 | Savant et al. | |
| 2023/0268409 | A1* | 8/2023 | Chen | H10D 30/6735 257/401 |
| 2024/0071767 | A1* | 2/2024 | Chen | H01L 21/3115 |
| 2025/0316495 | A1* | 10/2025 | Hsu | H10D 84/0144 |

FOREIGN PATENT DOCUMENTS

| | | | |
|---|---|---|---|
| TW | 201919113 | A | 5/2019 |
| TW | 202119481 | A | 5/2021 |

* cited by examiner

SEMICONDUCTOR DEVICES AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. This scaling down process generally provides benefits by increasing production efficiency and lowering associated costs.

When fabricating field effect transistors (FETs), as FET devices continue scaling down, lower threshold voltage (Vt) in gate terminals is desired in order to further speed up the operation of the FET devices. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
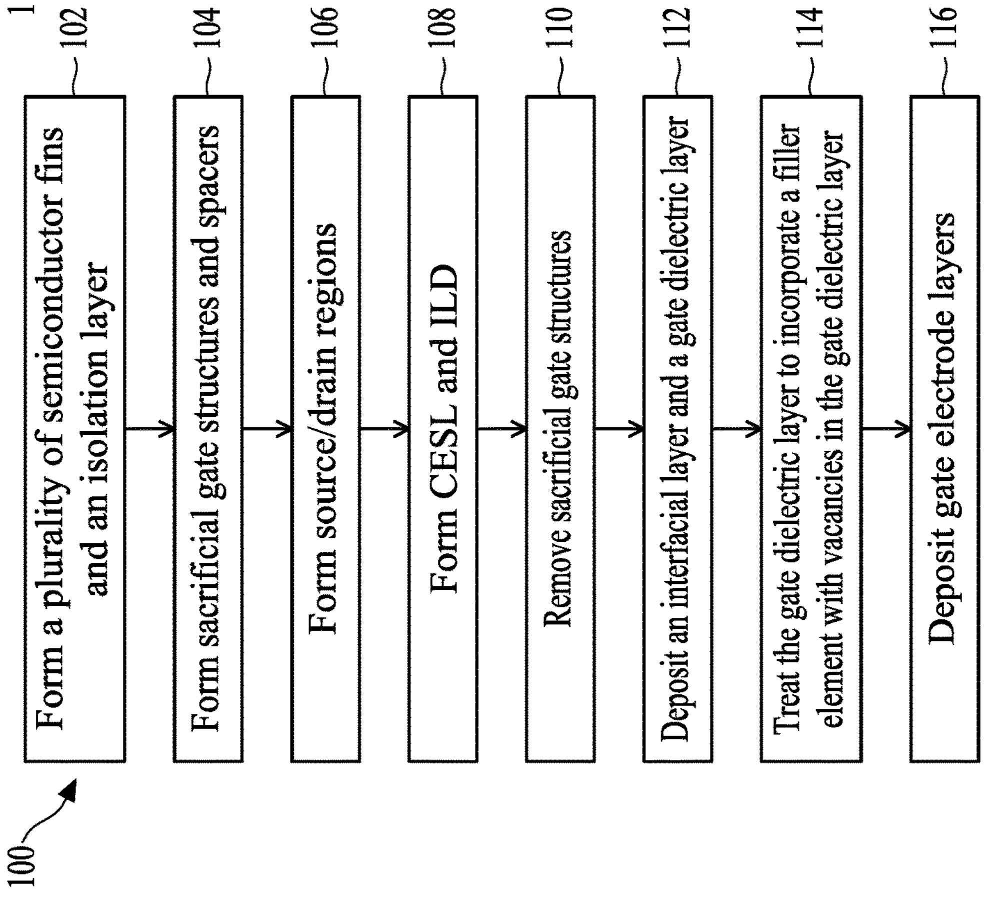
FIG. 1A is a flow chart of a method for manufacturing of a semiconductor substrate according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
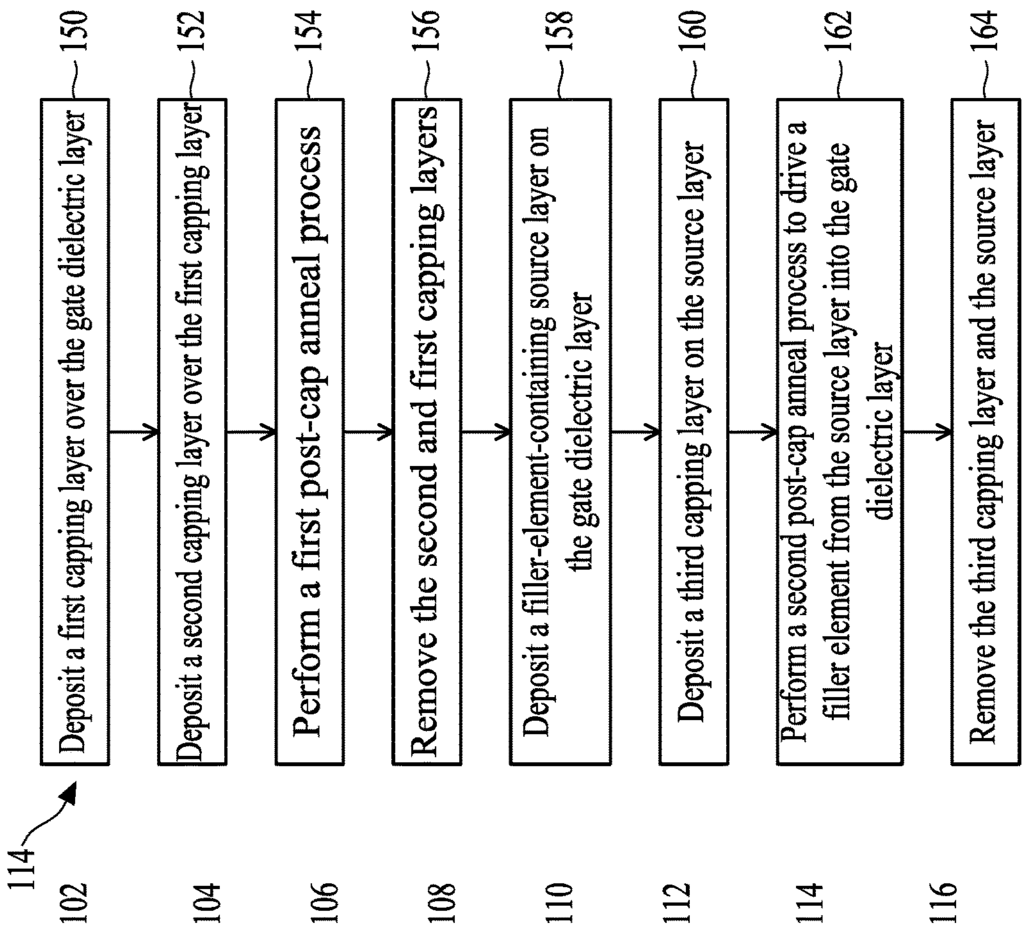
FIG. 1B is a flow chart of a method for treating a gate dielectric layer according to embodiments of the present disclosure.

FIG. 1A is a flow chart of a method 100 for manufacturing of a semiconductor substrate according to embodiments of the present disclosure. FIG. 1B is a flow chart of a method for treating a gate dielectric layer according to embodiments of the present disclosure. FIGS. 2A-2C, 3A-3B, 4A-4B, 5A-5E, and 6A-6B schematically illustrate various stages of manufacturing a semiconductor device 200 according to the method 100. Additional operations can be provided before, during, and after operations/processes in the method 100, and some of the operations described below can be replaced or eliminated, for additional embodiments of the method. The order of the operations/processes may be interchangeable.

The semiconductor device 200 in the example below is a GAA device. It should be noted that embodiments of the present disclosure may be applied to other semiconductor devices, such as FinFET devices, and planar devices.

Figure 2A:
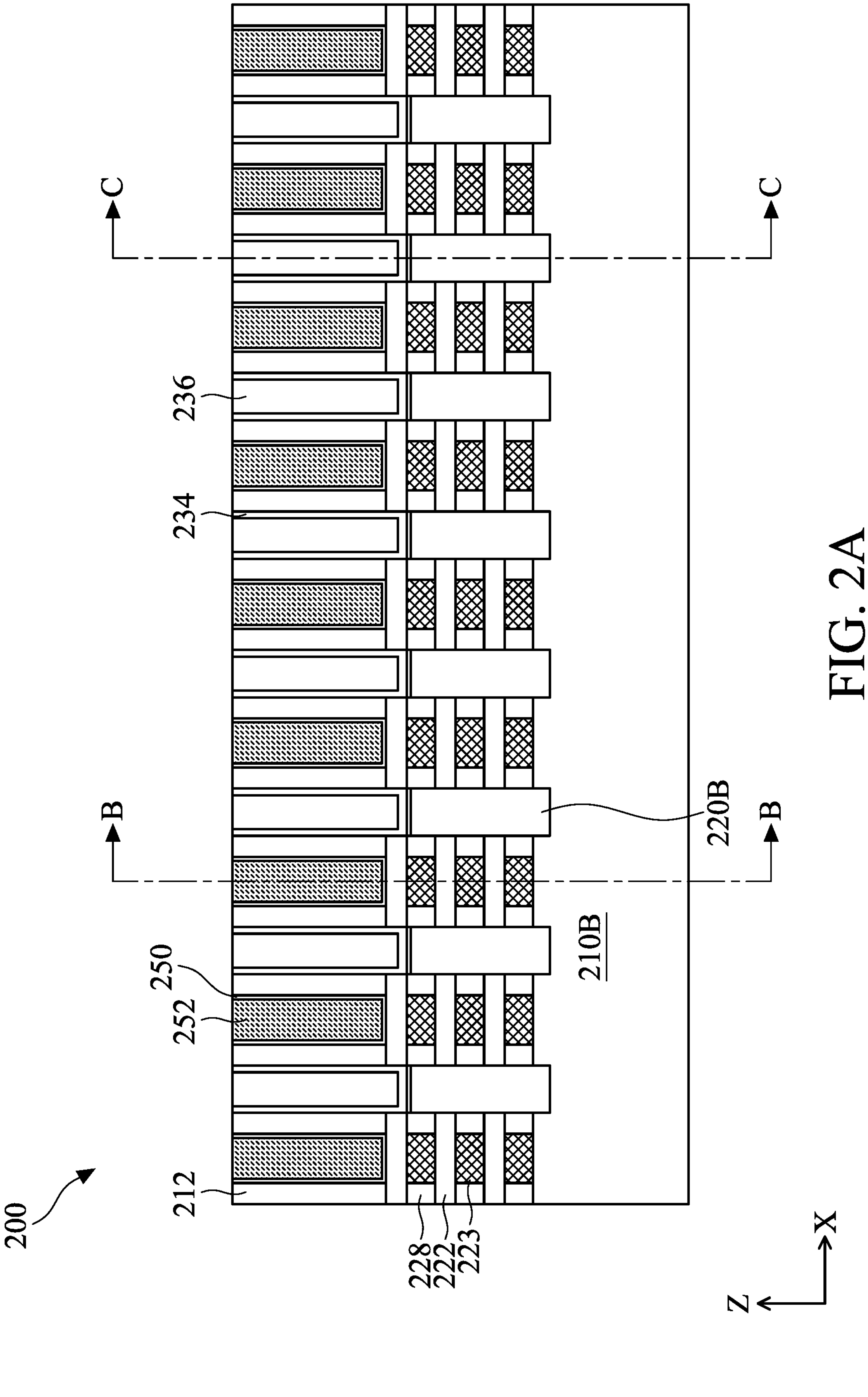
FIGS. 2A-2C, 3A-3B, 4A-4B, 5A-5E, and 6A-6B schematically illustrate various stages of manufacturing a semiconductor device according to embodiments of the present disclosure.
Figure 2B:
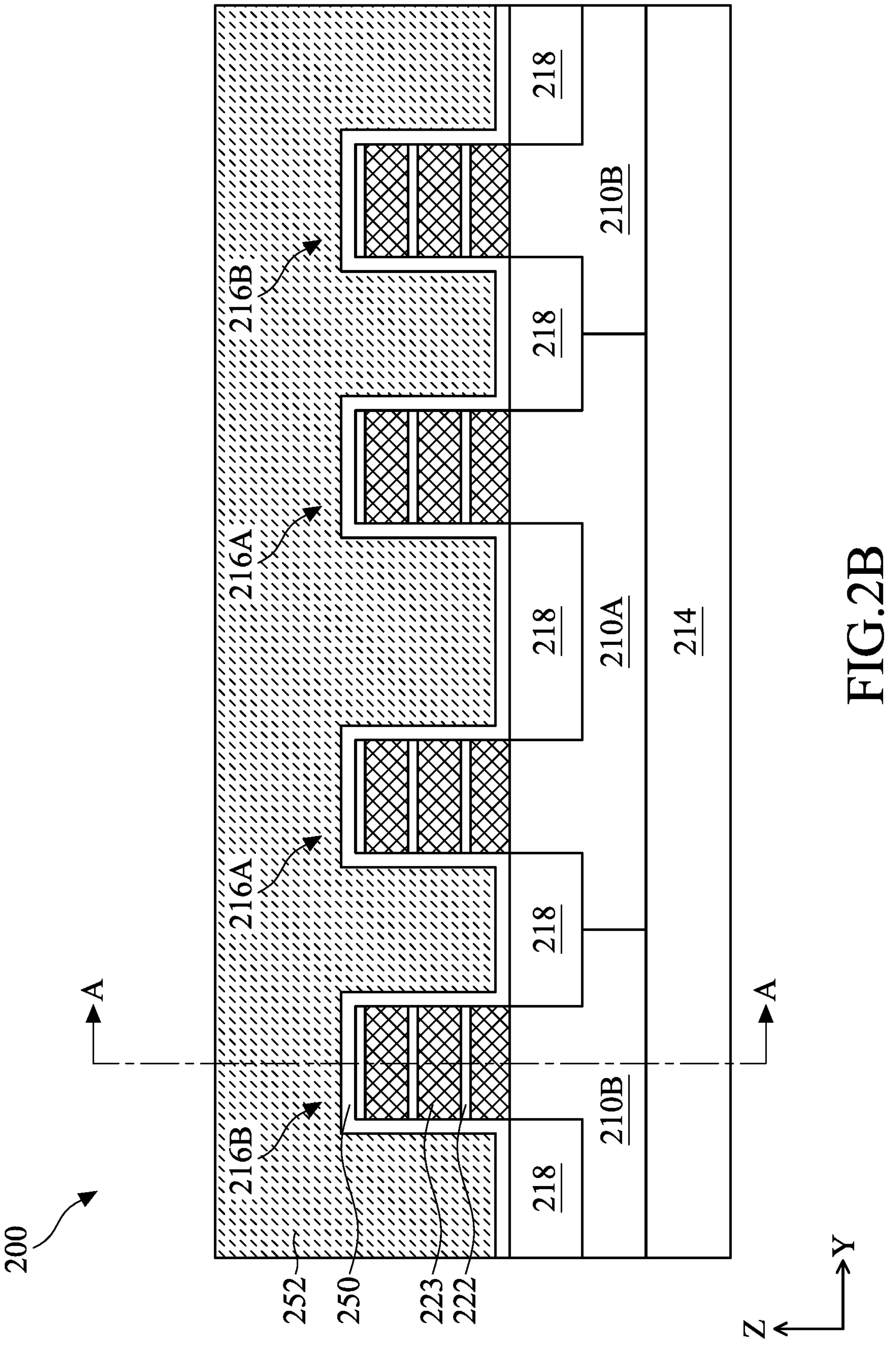
Figure 2C:
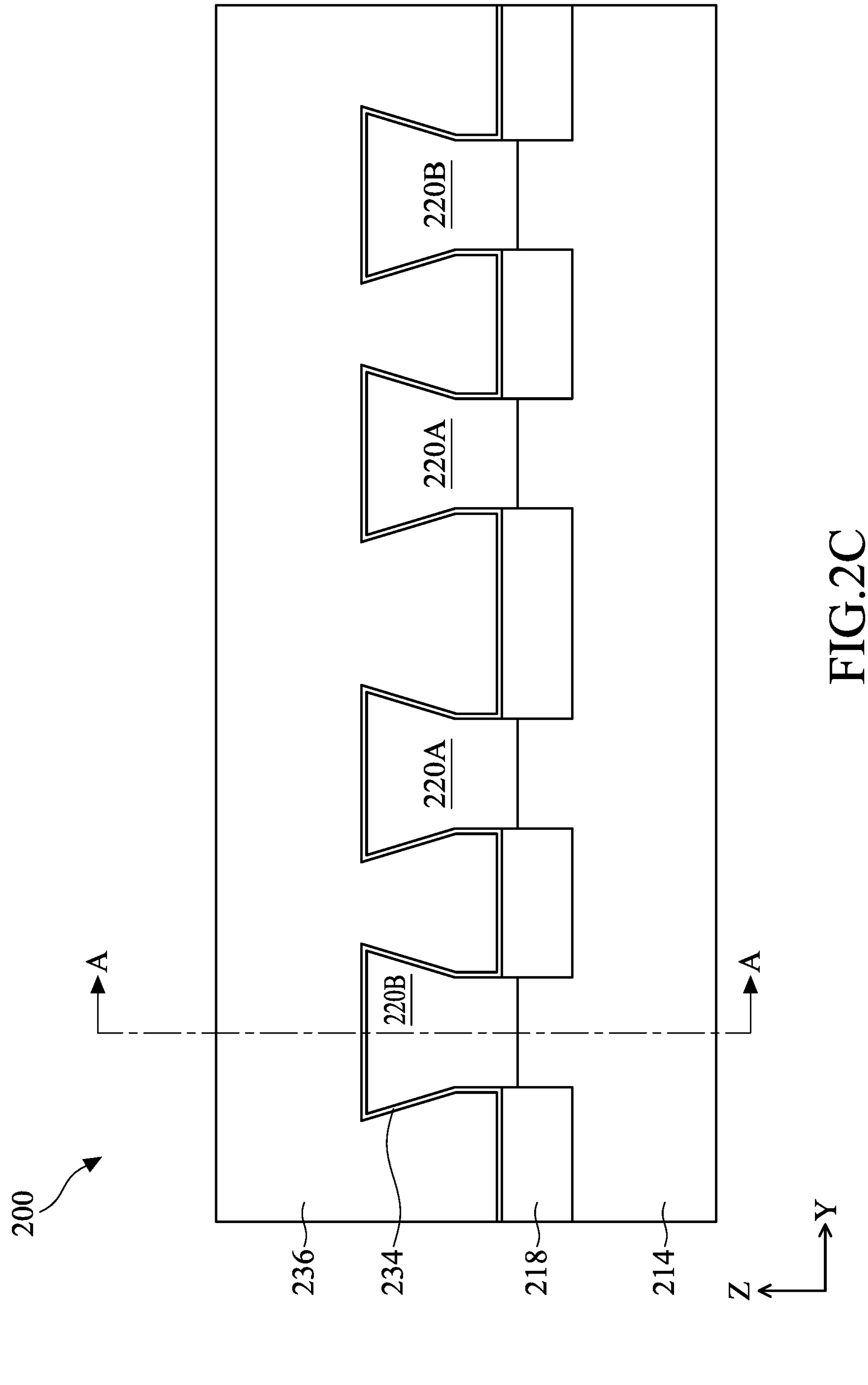

In some embodiments, the semiconductor device 200 may be included in a microprocessor, a memory, and/or other IC device. In some embodiments, the semiconductor device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors. FIGS. 2A-2C have been simplified for the sake of clarity to better understand the inventive concepts of the present disclosure. In some embodiments, the semiconductor device 200 may be a portion of an array of memory cells, such as static random-access memory (SRAM) cells. Additional features can be added in the semiconductor device 200, and some of the features described below can be replaced, modified, or eliminated in other embodiments of the semiconductor device 200.

The method 100 begins at operation 102, where semiconductor fins 216A, 216B are formed over a substrate 214, as shown in FIGS. 2A-2C. FIGS. 2A-2C are schematic sectional views of the semiconductor device 200. FIGS. 2B, 2C are schematic cross-sectional views of the semiconductor device 200 along the “B-B” line and the “A-A” line in FIG. 2A respectively. FIG. 2A is schematic cross-sectional views of the semiconductor device 200 along the “A-A” line in FIG. 2B respectively.

The substrate 214 is provided to form the semiconductor device 200 thereon. The substrate 214 may include a single crystalline semiconductor material such as, but not limited to Si, Ge, SiGe, GaAs, InSb, GaP, GaSb, InAlAs, InGaAs, GaSbP, GaAsSb, and InP. The substrate 214 may include various doping configurations depending on circuit design. For example, different doping profiles, e.g., n-wells, p-wells, may be formed in the substrate 214 in regions designed for different device types, such as n-type field effect transistors (NFET), and p-type field effect transistors (PFET). In some embodiments, the substrate 214 may be a silicon-on-insulator (SOI) substrate including an insulator structure (not shown) for enhancement.

The substrate 214 includes a p-doped region or p-well 210B and an n-doped region or n-well 210A. One or more n-type devices, such as NFETs, are to be formed over and/or within p-well 210B. One or more p-type devices, such as PFETs, are to be formed over and/or within n-well 210A.

A semiconductor stack may be formed over the n-well 210A and patterned to form the semiconductor fin 216A. The semiconductor stack includes alternating semiconductor layers made of different materials to facilitate formation of nanosheet channels in a multi-gate p-type device, such as nanosheet channel PFETs. A semiconductor stack may be formed over the n-well 210B and patterned to form the semiconductor fin 216B. The semiconductor stack includes alternating semiconductor layers made of different materials to facilitate formation of nanosheet channels in a multi-gate n-type device, such as nanosheet channel NFETs. In some embodiments, the semiconductor stack includes first semiconductor layers 222 interposed by second semiconductor layers 223. The first semiconductor layers 222 and second semiconductor layers 223 have different compositions and different oxidation rates and/or different etch selectivity. In later fabrication stages, portions of the second semiconductor layers 222 form nanosheet channels in a multi-gate device. More or less semiconductor layers 222 and 223 may be included in the semiconductor stack depending on the desired number of channels in the semiconductor device to be formed. In some embodiments, the number of semiconductor layers 222 and 223 is between 1 and 10.

The semiconductor layers 222 are intended to be channels for GAA devices. The semiconductors 223 are intended to be sacrificial layers between channels in GAA devices. In some embodiments, the semiconductor layer 223 may include silicon germanium (SiGe). The semiconductor layer 223 may be a SiGe layer including more than 25% Ge in molar ratio. For example, the semiconductor layer 223 may be a SiGe layer including Ge in a molar ration in a range between 25% and 50%. The semiconductor layer 222 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the semiconductor layer 222 may be a Ge layer. The semiconductor layer 222 may include p-type dopants, boron etc. The semiconductor layer 222 may include silicon (Si). In some embodiments, the semiconductor layer 222 may include n-type dopants, such as phosphorus (P), arsenic (As), etc.

The semiconductor layers 222, 223 may be formed by a molecular beam epitaxy (MBE) process, a metalorganic chemical vapor deposition (MOCVD) process, and/or other suitable epitaxial growth processes. The semiconductor fins 216A, 216B are formed from the semiconductor stacks and a portion of the n-well 210A, the p-well 210B underneath respectively. Each semiconductor fin 216A, 216B has an active portion formed from the semiconductor stacks, and a well portion formed in the n-well 210A, the p-well 210B, respectively.

The isolation layer 218 is then formed by filling in the trenches between the semiconductor fins 216A, 216B and then etching back to below the semiconductor stacks the semiconductor fins 216A, 216B. The isolation material is deposited over the substrate 214 to cover at least a part of the well portions of the semiconductor fins 216A, 216B. The isolation material may be formed by a high-density plasma chemical vapor deposition (HDP-CVD), a flowable CVD (FCVD), or other suitable deposition process. In some embodiments, the isolation material may include silicon oxide, silicon nitride, silicon oxynitride, fluorine-doped silicate glass (FSG), a low-k dielectric, combinations thereof. In some embodiments, the isolation material is formed to cover the semiconductor fins 216A, 216B by a suitable deposition process to fill the trenches between the semiconductor fins 216A, 216B, and then recess etched using a suitable anisotropic etching process to expose the active portions of the semiconductor fins 216A, 216B resulting in the isolation layer 218.

In operation 104, sacrificial gate structures and spacers then formed over the fins 216A, 216B, as shown in FIGS. 2A-2C. A sacrificial gate dielectric layer 250 is deposited over the exposed surfaces of the semiconductor device 200. The sacrificial gate dielectric layer 250 may be formed conformally over the semiconductor fins 216A, 216B, and the isolation layer 218. In some embodiments, the sacrificial gate dielectric layer 250 may be deposited by a CVD process, a sub-atmospheric CVD (SACVD) process, a FCVD process, an ALD process, a PVD process, or other suitable process. The sacrificial gate dielectric layer 250 may include one or more layers of dielectric material, such as $SiO_2$, SiN, a high-K dielectric material, and/or other suitable dielectric material.

A sacrificial gate electrode layer 252 is deposited over the exposed surfaces of the semiconductor device 200. The sacrificial gate electrode layer 252 may be blanket deposited on the over the sacrificial gate dielectric layer 250. The sacrificial gate electrode layer 252 includes silicon such as polycrystalline silicon or amorphous silicon. The thickness of the sacrificial gate electrode layer is in a range between about 42 nm and about 200 nm. In some embodiments, the sacrificial gate electrode layer 252 is subjected to a planarization operation. The sacrificial gate electrode layer 252 may be deposited using CVD, including LPCVD and PECVD, PVD, ALD, or other suitable process.

The sacrificial gate structures are formed over the isolation layer 218 and over the exposed portions of the semiconductor fins 216A, 216B. The sacrificial gate structures are formed over portions of the semiconductor fins 216A, 216B which are to be channel regions. A patterning operation is performed the sacrificial gate electrode layer 252 and the sacrificial gate dielectric layer 250 to form the sacrificial gate structures.

The sidewall spacers 212 and inner spacers 228 are then formed. The sidewall spacers 212 are formed on sidewalls of the sacrificial gate structures. After the sacrificial gate structures are formed, the sidewall spacers 212 are formed by a blanket deposition of an insulating material followed by anisotropic etch to remove insulating material from horizontal surfaces. The sidewall spacers 212 may have a thickness in a range between about 4 nm and about 7 nm. In some embodiments, the insulating material of the sidewall spacers 212 is a silicon nitride-based material, such as SiN, SiON, SiOCN or SiCN and combinations thereof. The exposed semiconductor fins 216A, 216B are etched and the inner spacers 228 are formed. Even though described together in each operation, processes for regions for p-type devices, i.e., over the n-well 210A, and for n-type devices, i.e., over the p-well 210B, may be performed separately using patterned masks and different processing recipes.

The semiconductor fins 216A, 216B not covered by the sacrificial gate structures are etched to expose well portions of the semiconductor fins 216A, 216B. In some embodiments, suitable dry etching and/or wet etching may be used to remove the semiconductor layers 222, 223, together or separately.

After recess etch of the semiconductor fins 216A, 216B, the inner spacers 228 are formed. To form the inner spacers 228, the semiconductor layers 223 under the sidewall spacers 212 are selectively etched from the semiconductor layers 222 along the horizontal direction, or x-direction, to form spacer cavities. In some embodiments, the semiconductor layers 223 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the semiconductor layers 223 is in a range between about 2 nm and about 10 nm along the X direction.

After forming the spacer cavities, the inner spacers 228 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 228. The inner spacers 228 have a thickness along the X direction in a range from about 4 nm to about 7 nm.

In operation 106, epitaxial source/drain regions 220A, 220B are formed, as shown in FIGS. 2A-2C. As discussed above, the epitaxial source/drain regions 220A for the p-type devices and the epitaxial source/drain regions 220B for the n-type devices are formed using patterned masks and different epitaxial processes.

The epitaxial source/drain regions 220A for the p-type devices may include one or more layers of Si, SiGe, Ge with p-type dopants, such as boron (B), for a p-type device, such as pFET. In some embodiments, the epitaxial source/drain regions 220A may be SiGeB material, wherein boron is a dopant. The epitaxial source/drain regions 220B for n-type devices may include one or more layers of Si, SiP, SiC and SiCP. The epitaxial source/drain regions 220B also include n-type dopants, such as phosphorus (P), arsenic (As), etc. In some embodiments, the epitaxial source/drain regions 220B may be a Si layer includes phosphorus dopants.

In operation 108, contact etch stop layer (CESL) 234 and interlayer dielectric (ILD) layer 236 are then formed over the exposed surfaces as shown in FIGS. 2A-2C. The CESL 234 is formed on the epitaxial source/drain regions 220A, 220B the sidewall spacers 212, and the isolation layer 218. In some embodiments, the CESL 234 has a thickness in a range between about 4 nm and about 7 nm. The CESL 234 may include $Si_3N_4$, SiON, SiCN or any other suitable material, and may be formed by CVD, PVD, or ALD.

The interlayer dielectric (ILD) layer 236 is formed over the CESL 234. The materials for the ILD layer 236 include compounds comprising Si, O, C, and/or H, such as silicon oxide, SiCOH and SiOC. Organic materials, such as polymers, may be used for the ILD layer 236. The ILD layer 236 protects the epitaxial source/drain regions 220A, 220B during the removal of the sacrificial gate structures. A planarization process may be performed after depositing the ILD layer 236 to expose the sacrificial gate electrode layer 252.

Figure 3A:
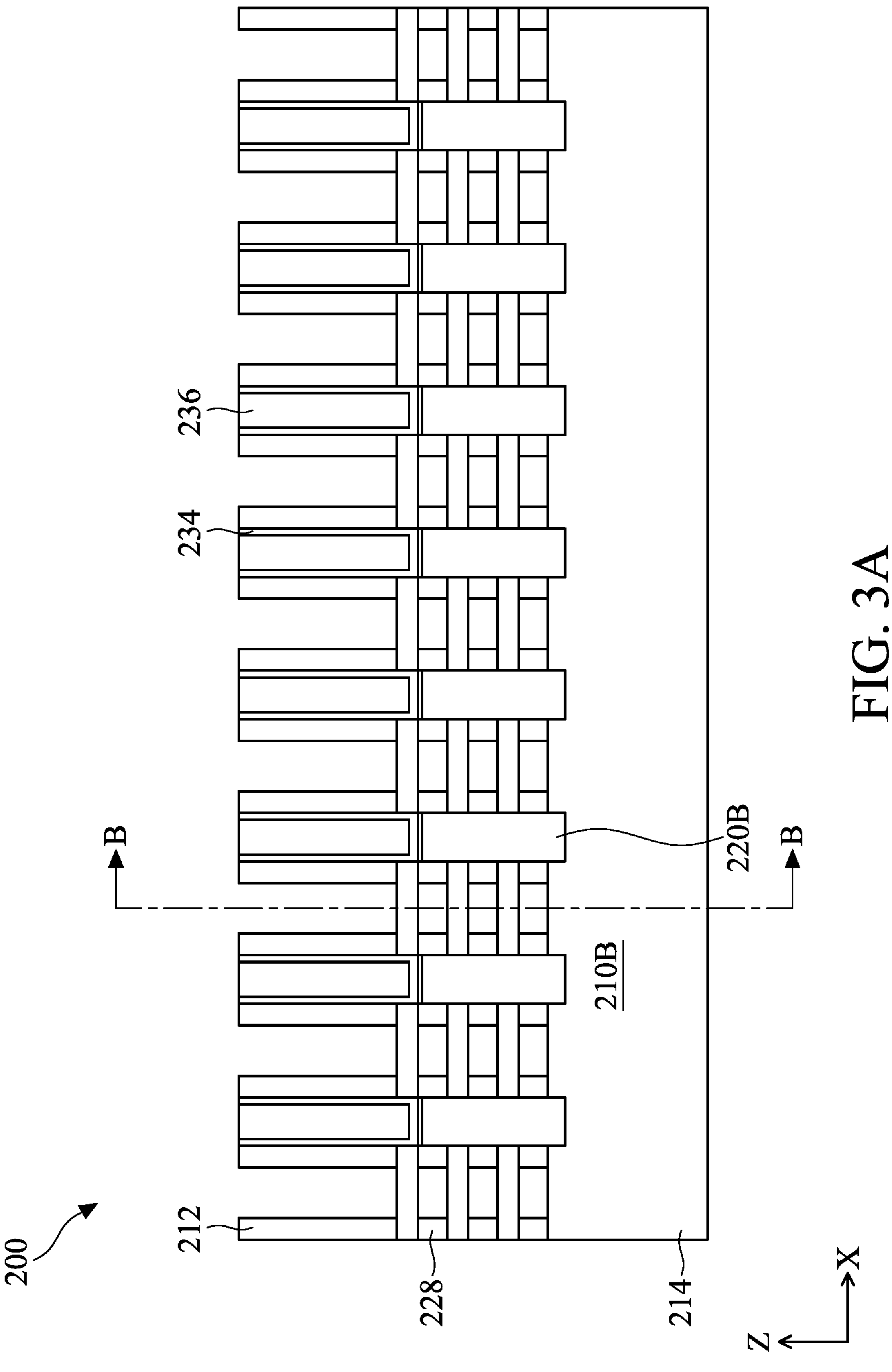
Figure 3B:
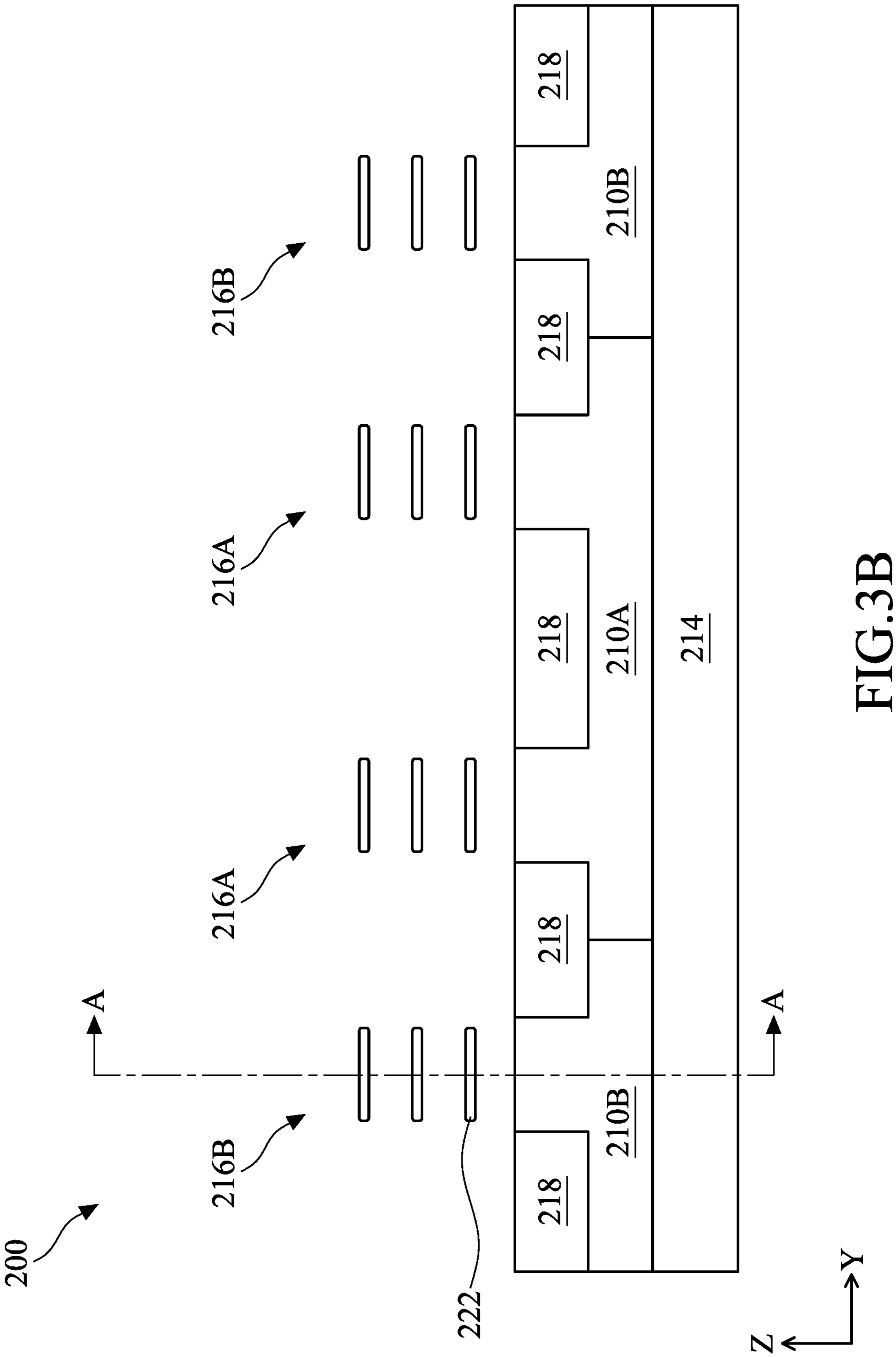

In operation 110, the sacrificial gate structures and the semiconductor layers 223 are removed to expose the semiconductor layers 222, as shown in FIGS. 3A-3B. FIG. 3A is a schematic cross-sectional view along the A-A line in FIG. 3B. FIG. 3B is a schematic cross-sectional view along the B-B line in FIG. 3A. The sacrificial gate electrode layer 252 and the sacrificial gate dielectric layer 250 may be sequentially removed. The sacrificial gate electrode layer 252 can be removed using plasma dry etching and/or wet etching. When the sacrificial gate electrode layer 252 is polysilicon, a wet etchant such as a Tetramethylammonium hydroxide (TMAH) solution can be used to selectively remove the sacrificial gate electrode layer 252 without removing the dielectric materials of the ILD layer 236, the CESL 234. The sacrificial gate dielectric layer 250 may be removed using a suitable etch process after removal of the sacrificial gate electrode layer 252.

The semiconductor layers 223 are then removed during the same etch process or different processes. The semiconductor layers 223 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 4A:
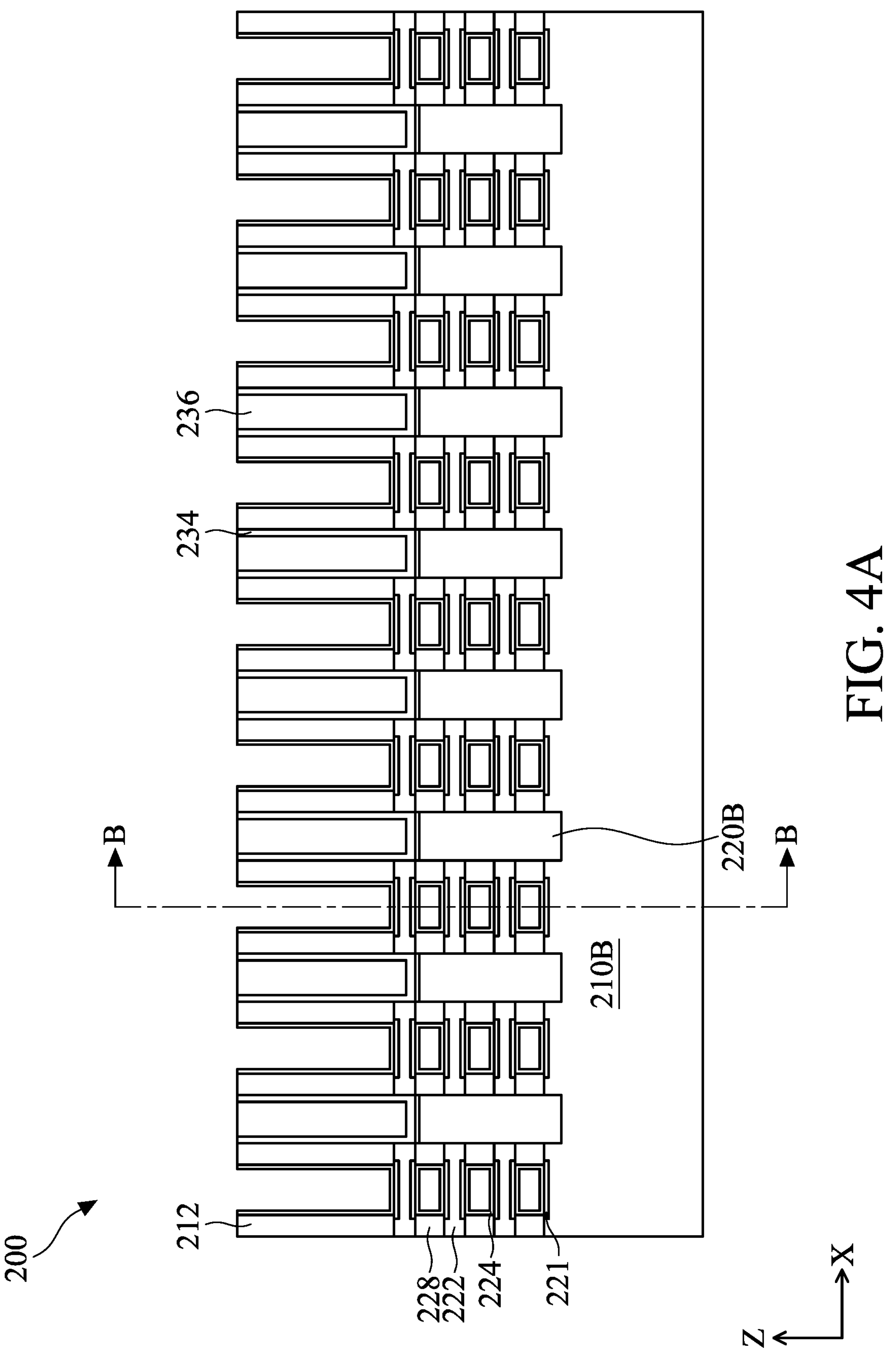
Figure 4B:
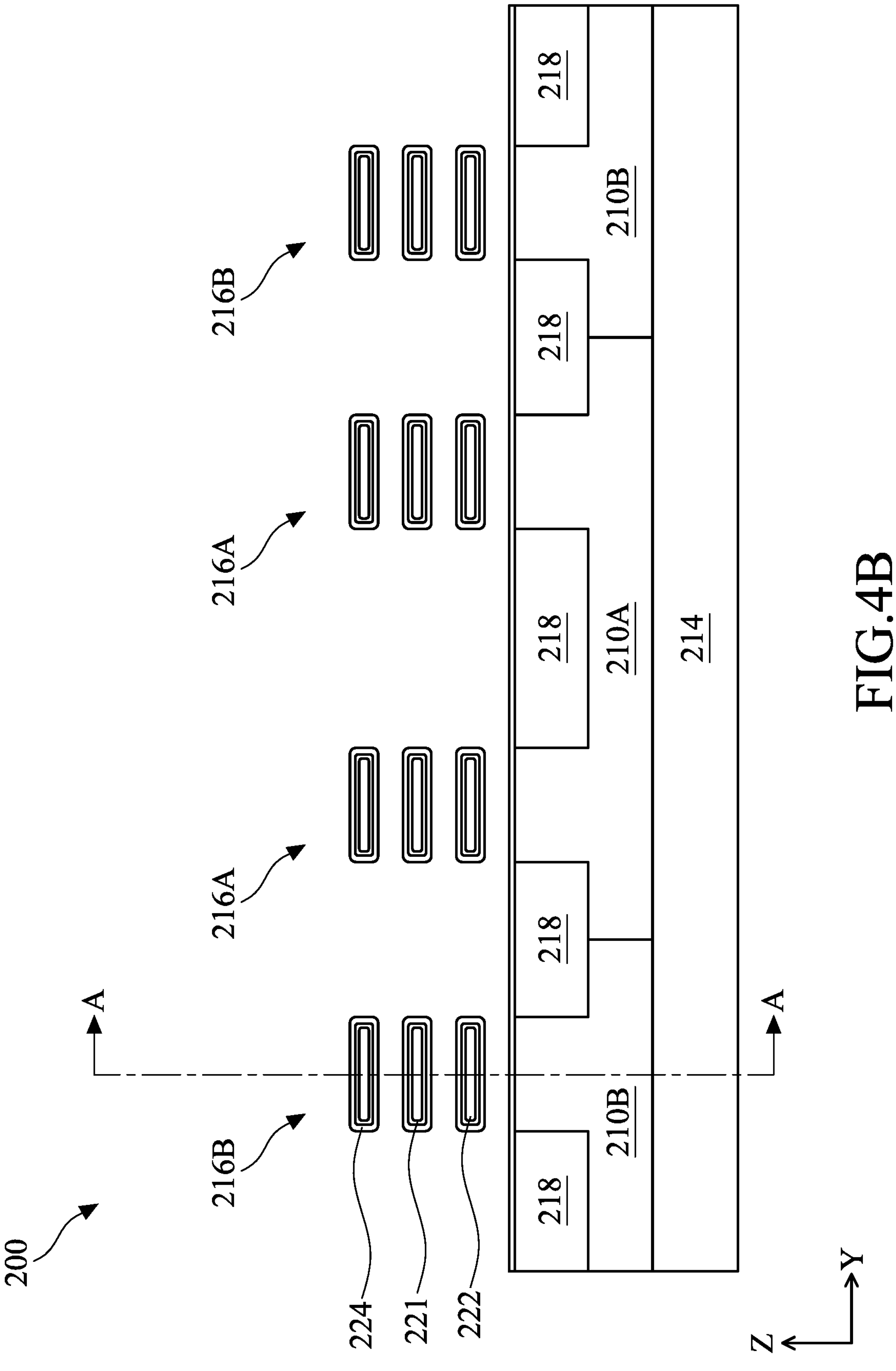

In operation 112, an interfacial layer 221 and a high-K dielectric layer 224 are formed over the semiconductor layers 223, as shown in FIGS. 4A-4B. FIG. 4A is a schematic cross-sectional view along the A-A line in FIG. 4B. FIG. 4B is a schematic cross-sectional view along the B-B line in FIG. 4B.

After removal of the semiconductor layers 223, the interfacial layer 221 is formed on exposed surfaces of the channel regions, i.e., exposed surfaces of the semiconductor layers 222. The interfacial layer 221 may include a dielectric material such as silicon oxide layer (SiO2), silicon nitride layer (SiN), silicon oxynitride (SiON), and mixed silicon-germanium oxide. The interfacial layer 221 may be formed using chemical oxidation process. Alternatively, the interfacial layer 221 may be formed by thermal oxidation, atomic layer deposition (ALD), chemical vapor deposition (CVD), and/or other suitable methods. In some embodiments, the interfacial layer 221 may have a thickness in a range from about 0.2 nm to about 6 nm.

The high-K dielectric layer 224 is deposited on the interfacial layer 221 and other exposed surfaces on the semiconductor device 200, as shown in FIGS. 4A-4B. In some embodiments, the high-K dielectric layer 224 may have different composition and dimensions for the n-type devices and p-type devices and are formed separately using patterned mask layers and different deposition recipes.

The high-K dielectric layer 224 may include one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. In some embodiments, the high-K dielectric layer 224 is a high-K material with a dielectric constant (k-value) greater than about 3.9, for example a k-value in a range between 4.0 and 30. The high-K dielectric layer 224 may include hafnium oxide, lanthanum, oxide, aluminum oxide, yttrium oxide or combinations thereof.

In some embodiments, the high-K dielectric layer 224 may be blanket deposited in succession using atomic layer deposition (ALD) or plasma-enhance atomic layer deposition (PEALD) methods. Alternatively, the high-K dielectric layer 224 may be formed by CVD or any suitable methods. In some embodiments, the thickness of the high-K dielectric layer 224 is in a range between about 1 nm and about 6 nm.

In operation 114, the high-K dielectric layer 224 is treated to incorporate a filler element with vacancies in the high-K dielectric layer 224, as shown in FIGS. 5A-5D. FIGS. 5A-5D are schematic enlarged partial sectional views of the high-K dielectric layer 224 during operation 114.

The high-K dielectric layer 224 is a portion of work function layers within the gate structure of a subsequently formed transistors, such as GAA FETs or finFETs. The work function layers control, in part, the threshold voltage of the transistors. More particularly, the threshold voltage value of a FET, such as a GAA FET or a finFET, depends on the collective thickness and type of the work function layers. In some embodiments, the threshold voltage value may be adjusted by tuning vacancies in the high-K dielectric layer 224.

P-type FETs and n-type FETs exhibit a different absolute threshold voltage, e.g., the magnitude of the threshold voltage without regard to polarity. For example, p-type FETs require a higher voltage to turn-on, e.g., to allow current to flow between the source and the drain terminals of the transistor. The magnitude of the threshold voltage is related to the work function layers, for example component of layers, thickness and composition of the layers. Work function layers used in p-type FETs and n-type FETs may be different in terms of thickness, number, and/or composition. Typically, p-type FETs have a higher absolute threshold voltage than n-type FETs.

Embodiments of the present disclosure provide a method for treating the high-K dielectric layer 224 to improve threshold voltage control. In some embodiments, a solid phase anneal process is performed to drive a filler element into the high-K dielectric layer of a work function layer stack, such as the high-K dielectric layer 224 in the semiconductor device 200. Atoms of the filler element may fill vacancies in the high-K dielectric material, thereby improving reliability of the work function layer stack. The treatment to the high-K dielectric layer 224 according to the present disclosure has proven to increase current through the channels, reduce threshold voltage, and reduce metal boundary effect in semiconductor devices, such as SRAM cells.

The treatment of the high-K dielectric layer 224 may be performed in a process sequence. In some embodiments, the filler element may be introduced into the high-K dielectric layer 224 using a solid phase annealing process. In some embodiments, the filler element may be fluorine. A fluorine containing source layer may be first deposited on the high-K dielectric layer 224. An anneal process is then performed to drive the filler element from the source layer into the high-K dielectric layer 224. In some embodiments, a capping layer may be deposited over the source layer prior to the anneal process.

In some embodiments, the treatment to the high-K dielectric layer 224 may be performed according to the process sequence shown in FIG. 1B. Particularly, the high-K dielectric layer 224 may be annealed twice. A first anneal process is performed to improve crystalline structure of the high-K dielectric layer 224, for example, to reduce voids in the high-K dielectric layer 224. A second anneal process is performed to drive the filler element to the high-K dielectric layer 224. Alternatively, the first anneal process may be omitted. As shown in FIG. 1B, the operation 114 may be performed using operations 150 to 164. In operation 150 to 156, a first anneal process is performed. In operation 158 to 164, a second anneal process is performed.

Figure 5A:
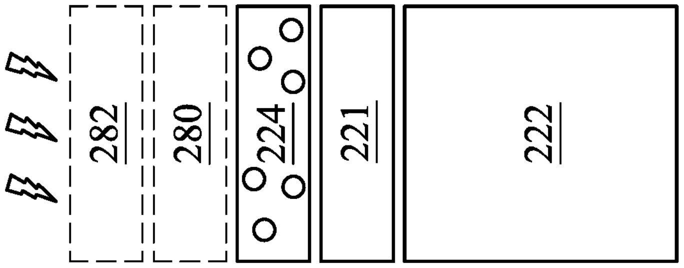

In operation 150, a first capping layer 280 is deposited over the high-K dielectric layer 224, as shown in FIG. 5A. The first capping layer 280 may be a nitride layer. The first capping layer 280 may be formed using ALD, CVD, or any suitable method. In some embodiments, the first capping layer 280 includes a TiN layer. In other embodiments, the first capping layer may be a TiSiN layer formed by alternatingly deposited TiN layers and SiN layers.

In some embodiments, an optional anneal process may be performed after deposition of the first capping layer 280. The optional anneal process may be performed in a temperature range between about 600° C. and about 900° C. The flash anneal duration may be in the range between about 2 seconds and about 120 seconds. The optional anneal process may be performed with a process gas comprising $NH_3$, $N_2$, $H_2$, $O_2$, and/or the like. Alternatively, the flash anneal process may be omitted.

In operation 152, a second capping layer 282 is deposited over the first capping layer 280, as shown in FIG. 5A. In some embodiments, the second capping layer 282 may include a silicon capping layer. The second capping layer 282 may be deposited using a silicon-containing precursor comprising silane, disilane, dichlorosilane (DCS), or the like.

In operation 154, an anneal process is performed, as shown in FIG. 5A. The anneal process may be referred to as a Post-Capping Annealing (PCA) process. The PCA process may be performed using furnace anneal, flash anneal, or the like. The temperature of the PCA process may be in a range between about 650° C. and about 1,100° C. The PCA process may be performed with a process gas comprising $NH_3$, $N_2$, $H_2$, $O_2$, and/or the like. The annealing duration may be in the range between about 2 seconds and about 120 seconds. In some embodiments, the annealing duration may be in a range between about 5 seconds to about 60 seconds.

The PCA process may be carried to reduce silicon/oxide interfacial traps between the channel region, i.e., the semiconductor layers 222 and the interfacial layer 221 and/or to improve interfacial mixing between the interfacial layer 221 and the high-K dielectric layer 224.

In some embodiments, the PCA process may be a flash anneal with a higher peak anneal temperature and shorter anneal time. In some embodiments, the peak anneal temperature is equal to or less than about 1250° C. The duration of the flash anneal is equal to or less than about 40 milliseconds. The flash anneal process may be carried out to reduce silicon/oxide traps in the interfacial layer 221 and the high-K dielectric layer 224.

In some embodiments, the PCA process may be carried out in a temperature range between about 600° C. and about 950° C. for a duration in a range from about 2 seconds to about 60 seconds improving intermixing between interfacial layer 221 and the high-K dielectric layer 224.

Figure 5B:
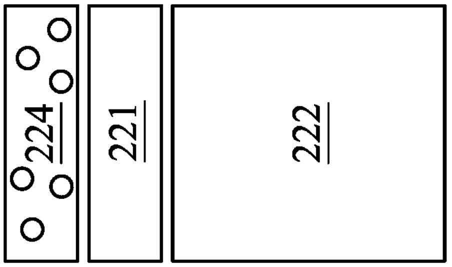

In operation 156, the second capping layer 282 and the first capping layer 280 are removed to expose the high-K dielectric layer 224, as shown in FIG. 5B. The deposition, annealing, and the subsequent removal of the first capping layer 280 and the second capping layer 282 may improve the reliability of the high-K dielectric layer 224 and the thermal stability of the high-K dielectric layer 224. In some embodiments, the operations 150, 152, 154, and 156 may be skipped.

Figure 5C:
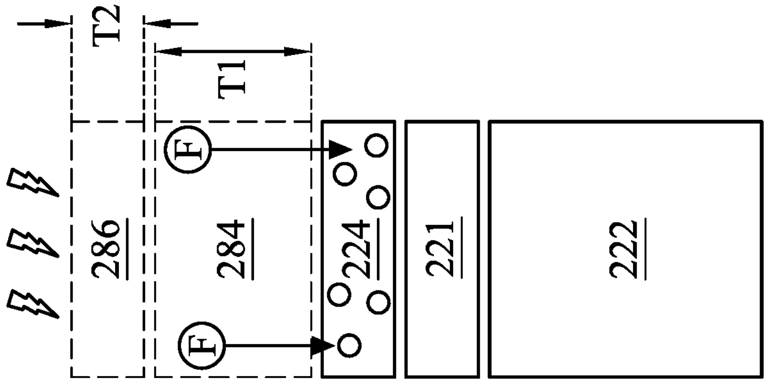

In operation 158, a source layer 284 is deposited over the high-K dielectric layer 224, as shown in FIG. 5C. The source layer 284 may be any suitable layer containing the filler element. In some embodiments, the filler element is fluorine and the source layer 284 is a fluorine containing layer. In some embodiments, the source layer 284 is a tungsten layer deposited using a fluorine containing precursor, such as tungsten hexafluoride ($WF_6$). The tungsten layer may be deposited using an ALD process with using tungsten hexafluoride ($WF_6$) and a reducing gaseous reactant. The reducing gas is a hydrogen containing chemical such as $B_2H_6$ and $Si_2H_6$. In some embodiments, process condition, such as pressure and duty cycles of the tungsten hexafluoride precursor and the reducing agents are selected to allow a percentage of fluorine to remain in the source layer 284, i.e., the tungsten layer. In some embodiments, the concentration of the fluorine in the source layer 284 may be controlled by measuring the gaseous byproduct in the in atomic layer deposition (ALD) of tungsten. In some embodiments, the source layer 284 may be a tungsten layer having a thickness T1 in a range between about 18 angstroms and about 28 angstroms. In some embodiments, the source layer 284 may include fluorine in molecular concentration in a range between about 20% and about 50%.

In operation 160, a third capping layer 286 is deposited over the source layer 284, as shown in FIG. 5C. The third capping layer 286 may include a nitride layer, for example TIN. The third capping layer may be formed by ALD or CVD process. In some embodiments, the third capping layer 286 may have a thickness in a range between about 9 angstroms and about 13 angstroms, for example about 11 angstroms.

In operation 162, a solid phase anneal process is performed to drive the filler element into the high-K dielectric layer 224, as shown in FIG. 5C. The solid phase anneal process may be performed using furnace anneal, flash anneal, or the like. Temperature of the solid phase anneal process may be in a range between about 500° C. and about 700° C. In some embodiments, the solid phase anneal process is performed at a temperature about 500° C. The solid phase anneal process may be performed with a process gas comprising $NH_3$, $N_2$, $H_2$, $O_2$, and/or the like. The annealing duration may be in a range between about 2 seconds and about 120 seconds.

As shown in FIG. 5C, the solid phase anneal process drives atoms of the filler element, i.e., atoms of fluorine, from the source layer 284 into the high-K dielectric layer 224. In some embodiments, the solid phase anneal process may result in fluorine concentration in the high-K dielectric layer 224 to increase for more than four times. In some embodiments, the high-K dielectric layer 224 may have fluorine with a molecular concentration in a range between about 10% and about 22%, for example about 18% and about 22%.

The fluorine atoms combine with vacancies in the high-K dielectric layer 224, thus, reducing the vacancies in the high-K dielectric layer 224. During operation, the vacancies in the high-K dielectric layer 224 may induce diffusion of metallic element, such as aluminum, for the work function metal layer or metal fill layer. Atoms of the filler element fill the vacancies in the high-K dielectric layer 224, thus, preventing the aluminum from diffusing into the high-K dielectric layer 224 and improving device performance. For example, when the semiconductor device 200 is SRAM cells, the increased fluorine atoms in the high-K dielectric layer 224 may reduce threshold voltage Vt, reduce metal boundary effect (caused by aluminum diffusion), reduce minimum drive voltage Vccmin, and increase cell current Icell.

Figure 5E:
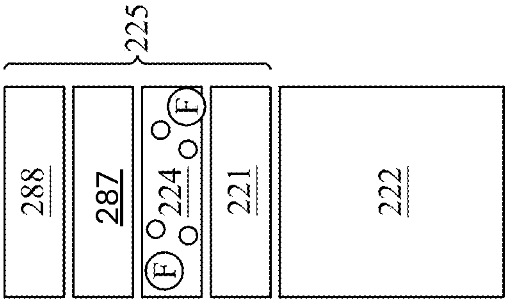
Figure 5D:
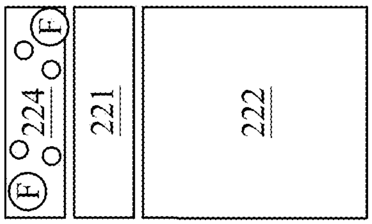

In operation 164, the third capping layer 286 and the source layer 284 are removed, as shown in FIG. 5D. Suitable process, such as etch process, may be used to remove the third capping layer 286 and the source layer 284.

After the removal of the third capping layer 286 and the source layer 284, the high-K dielectric layer 224 is exposed for subsequent process. FIG. 5E is a schematic enlarged partial sectional view of the gate structure after treatment of the high-K dielectric layer 224.

In some embodiments, a capping layer 287 is deposited over the high-K dielectric layer 224, as shown in FIG. 5E. In some embodiments, the capping layer 287 may include a lanthanum-based oxide layer, e.g., $LaO_x$. In some embodiments, the capping layer 287 may include other layers such as an $Al_2O_3$ layer, a $SiO_2$ layer, an $Y_2O_3$ layer, a titanium nitride (TiN) layer, a titanium silicon nitride (TiSiN) layer, a combination thereof, or other suitable capping layer. The capping layer 287 may be formed by PVD, CVD, ALD and/or other suitable methods In some embodiments, a barrier layer 288 is disposed over the capping layer 287, as shown in FIG. 5E. The barrier layer 288 may include a metal nitride. For example, the barrier layer 288 may include tantalum nitride, titanium nitride, niobium nitride, or a combination thereof. Various other materials are possible. The barrier layer 288 may be formed by ALD, PVD, CVD, or other suitable methods. The barrier layer 288 may be used to protect the capping layer 286 from various etching processes during work function metal layer patterning for threshold voltage tuning. For example, a p-type work function metal may be simultaneously deposited on p-type device regions and n-type device regions, and then portion in the n-type regions are replaced with an n-type work function metal. Alternatively, a n-type work function metal may be simultaneously deposited on p-type device regions and n-type device regions, and then portion in the p-type regions are replaced with a p-type work function metal. During these processes, the barrier layer 288 protects the capping layer 287 from being etched during the metal patterning/removal processes.

The high-K dielectric layer 224, the capping layer 287 and the barrier layer 288 may be collectively referred to as a gate dielectric layer 225. Depending on the design of the semiconductor device 200, more or less combination of layers may be deposited over the high-K dielectric layer 224 to form the gate dielectric layer 225.

Figure 6A:
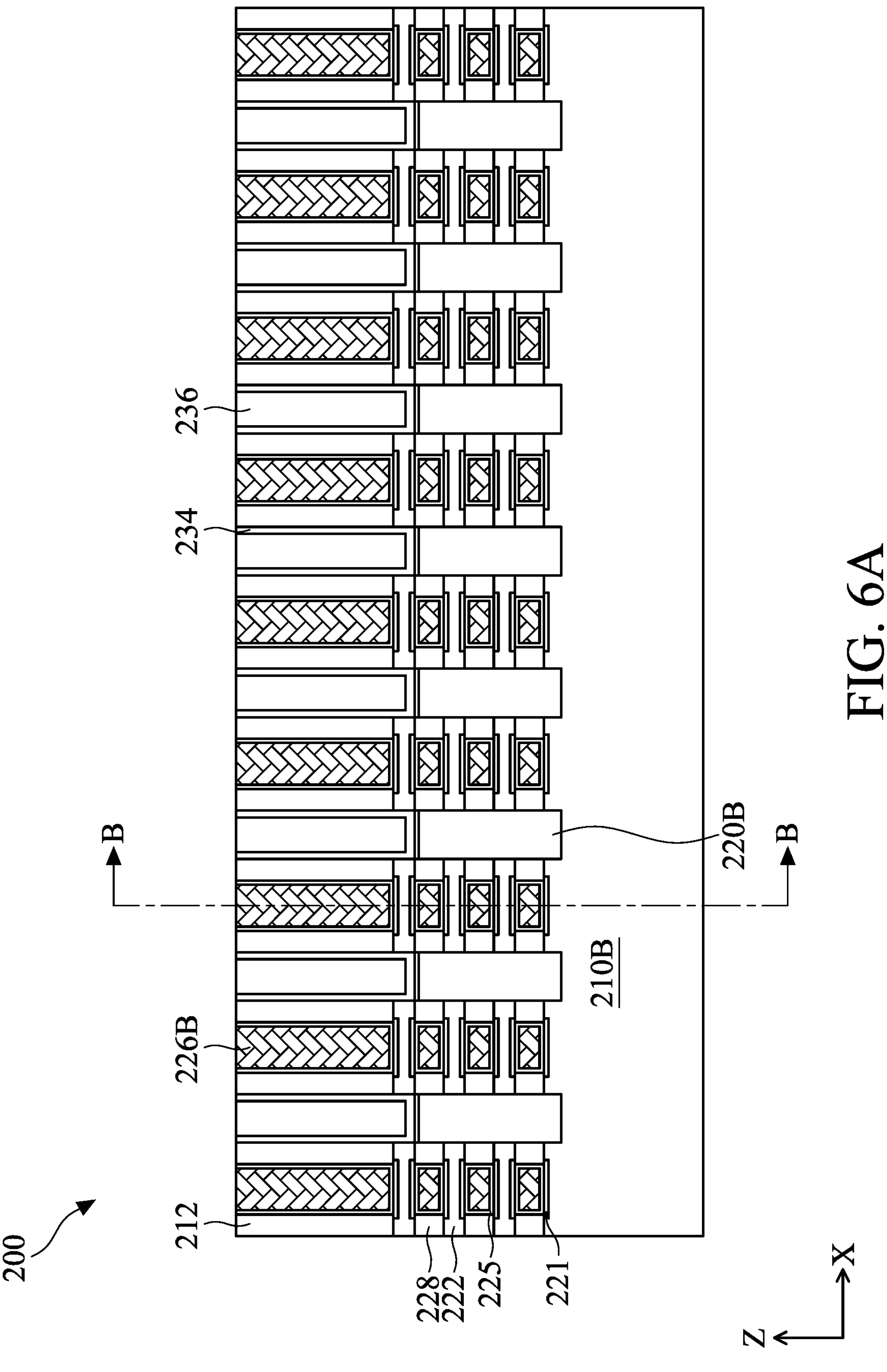
Figure 6B:
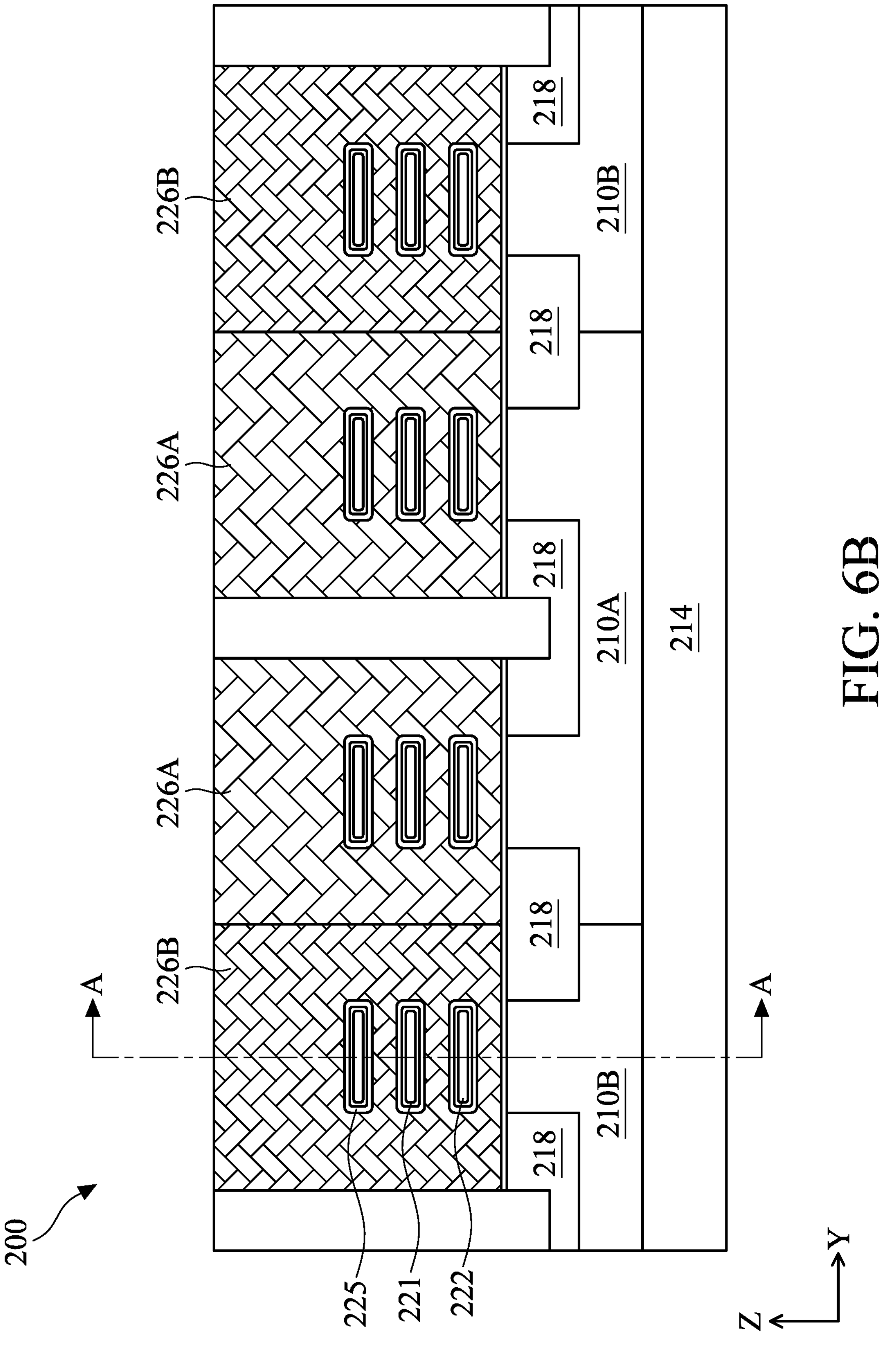

Referring to FIG. 1A, after the treatment sequence in operation 114, an operation 116 is performed to deposit a gate electrode layer 226, or work function metal layer, over the gate dielectric layer 225, as shown in FIGS. 6A-6B. FIG.

6A is a schematic cross-sectional view along the A-A line in FIG. 6B. FIG. 6B is a schematic cross-sectional view along the B-B line in FIG. 6A. As discussed above, the gate electrode layer 226 may include different materials for n-type devices and for p-type devices, and may be deposited sequentially using a patterning scheme.

In some embodiments, a p-type gate electrode layer 226A may be simultaneously deposited on p-type device regions and n-type device regions, and then portion in the n-type regions are replaced with an n-type gate electrode layer 226B, or vise versa.

The p-type gate electrode layer 226A may comprise a metal with a sufficiently large effective work function, selected from but not restricted to the group of titanium nitride (TIN), tantalum nitride (TaN), ruthenium (Ru), molybdenum (Mo), tungsten (W), platinum (Pt), or combinations thereof. The p-type gate electrode layer 226A may include one or more layers of materials. The p-type gate electrode layer 226A may be deposited by CVD, PVD, ALD, and/or other suitable process.

The n-type gate electrode layer 226B may include one or more layers of conductive materials. Particularly, the n-type gate electrode layer 226B comprises a metal with sufficiently low effective work function, selected from but not restricted to the group of titanium (Ti), aluminum (Al), zirconium (Zr), tantalum (Ta), niobium (Nb), titanium aluminum (TiAl), tantalum carbide (TaC), tantalum carbide nitride (TaCN), tantalum silicon nitride (TaSiN), titanium silicon nitride (TiSiN), titanium aluminum carbide (TiAlC), or combinations thereof. The n-type gate electrode layer 226B may be formed by PVD, CVD, ALD and/or other suitable methods. In some embodiments, the n-type gate electrode layer 226B includes aluminum (Al).

In some embodiments, a metal filling layer may be deposited over the gate electrode layer 226. The metal filling layer may be formed of tungsten or cobalt by a suitable method, such as ALD, CVD, or the like. After the formation of metal filling layer, a planarization process may be performed to remove excess portions of the deposited.

Figure 7:
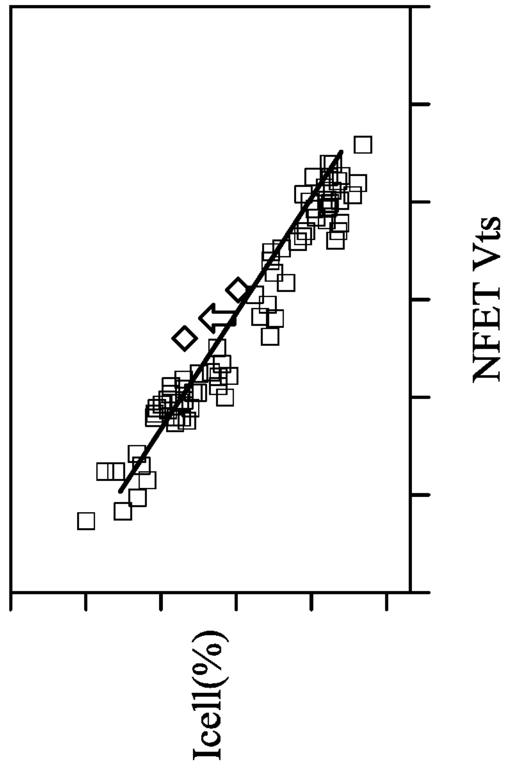
FIGS. 7 and 8 are graphs demonstrates performance improvements of semiconductor devices according to embodiments of the present disclosure.
Figure 8:
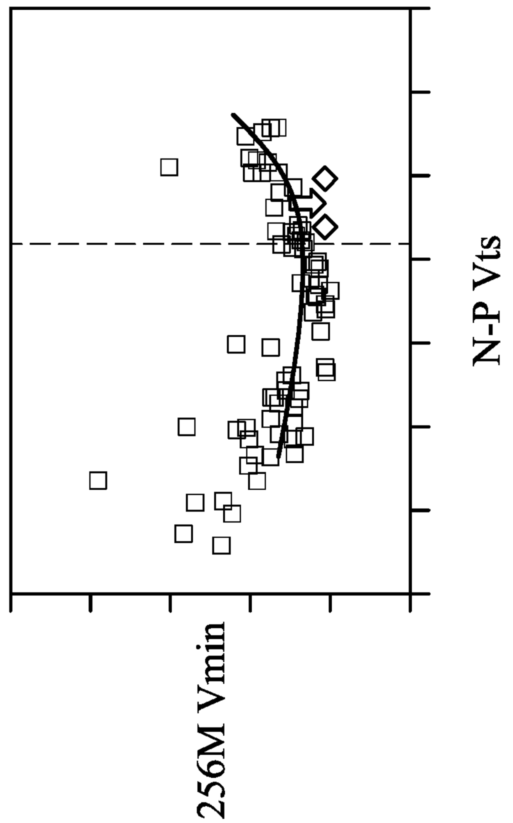

As discussed above, by incorporating fluorine with vacancies in a high-K dielectric layer in a gate structure, embodiments of the present disclosure achieve improved threshold voltage control, particularly for n-type FETs which include aluminum in work function metal layer. Embodiments of the present disclosure are particularly beneficial to SRAM cells. FIGS. 7 and 8 include graphs showing improvement in SRAM cells.

FIG. 7 includes channel current data Icell corresponding to various threshold voltage Vts for N-type FET in SRAM cells. The current data Icell of SRAM cells for state-of-the-art SRAM are shown in squares. The current data Icell of SRAM cells according to the present disclosure are shown in diamonds. As shown in FIG. 7, the SRAM cells according to the present disclosure, i.e., having a high-K dielectric layer with fluorine concentration between about 18% and about 22%, demonstrate a 10% increase in channel current Icell.

FIG. 8 includes minimum drive voltage Vmin for 256M SRAM cells corresponding to different N–P voltage difference. The current data Icell of SRAM cells for state-of-the-art SRAM are shown in squares. The current data Icell of SRAM cells according to the present disclosure are shown in diamonds. As shown in FIG. 8, the SRAM cells according to the present disclosure, i.e., having a high-K dielectric layer with fluorine concentration between about 18% and about 22%, demonstrate a 10% decrease in minimum drive voltage.

Various embodiments or examples described herein offer multiple advantages over the state-of-art technology. Using the solid phase anneal process according to the present disclosure, vacancies in gate high-K dielectric layers are reduced, therefore, preventing the aluminum from diffusing into the high-K dielectric layer and improving device performance. Particularly, embodiments of the present disclosure may reduce threshold voltage Vt, reduce metal boundary effect, reduce minimum drive voltage, and increase cell current.

It will be understood that not all advantages have been necessarily discussed herein, no particular advantage is required for all embodiments or examples, and other embodiments or examples may offer different advantages.

Some embodiments of the present provide a method comprising: depositing an interfacial layer on a semiconductor channel region; depositing a high-K dielectric layer on the interfacial layer; treating the high-K dielectric layer to incorporate a filler element with vacancies in the high-K dielectric layer; and depositing a gate electrode layer on the high-K dielectric layer.

Some embodiments of the present provide a method comprising, depositing an interfacial layer on a semiconductor channel region; depositing a high-K dielectric layer on the interfacial layer; depositing a source layer on the high-K dielectric layer, wherein the source layer containing fluorine; performing a solid phase anneal process to drive fluorine from the source layer to the high-K dielectric layer; removing the source layer; and depositing a gate electrode layer on the high-K dielectric layer.

Some embodiments provide a method comprising forming a semiconductor device comprising: a first source/drain region; a second source/drain region; a channel region disposed between the first and second source/drain regions; an interfacial layer formed on the channel region; a high-K dielectric layer formed on the interfacial layer, wherein the high-K dielectric layer comprises fluorine at a molecular concentration in a range between about 18% and about 22%; and a gate electrode layer disposed over the high-K dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

depositing an interfacial layer on a semiconductor channel region;

depositing a high-K dielectric layer on the interfacial layer;

depositing a first capping layer on the high-K dielectric layer;

depositing a second capping layer on the first capping layer;

performing a first anneal process;

removing the second capping layer;

treating the high-K dielectric layer to incorporate a filler element with vacancies in the high-K dielectric layer, wherein treating the high-K dielectric layer comprises:

depositing a source layer, wherein the source layer contains the filler element;

depositing a third capping layer over the source layer;

performing a second anneal process to incorporate the filler element into the high-K dielectric layer; and removing the third capping layer and the source layer; and depositing a gate electrode layer on the high-K dielectric layer.

2. The method of claim 1, wherein the filler element is fluorine.

3. The method of claim 2, wherein depositing the source layer comprises depositing a tungsten layer using a fluorine-containing precursor.

4. The method of claim 3, wherein the fluorine-containing precursor is tungsten hexafluoride.

5. The method of claim 3, wherein the third capping layer comprises titanium nitride.

6. The method of claim 5, wherein the source layer has a thickness in a range between about 18 angstroms and about 28 angstroms.

7. The method of claim 6, wherein the third capping layer has a thickness in a range between about 9 angstroms and about 13 angstroms.

8. The method of claim 6, wherein the second anneal process is performed at a temperature range between about 500° C. and about 700° C.

9. A method, comprising:

depositing an interfacial layer on a semiconductor channel region;

depositing a high-K dielectric layer on the interfacial layer;

depositing a titanium nitride layer on the high-K dielectric layer;

depositing a silicon layer on the titanium nitride layer;

performing an anneal process;

removing the silicon layer and the titanium nitride layer to expose the high-K dielectric layer;

depositing a source layer on the high-K dielectric layer, wherein the source layer contains fluorine;

performing a solid phase anneal process to drive fluorine from the source layer to the high-K dielectric layer;

depositing a first capping layer on the source layer prior to performing the solid phase anneal process;

removing the first capping layer;

removing the source layer; and depositing a gate electrode layer on the high-K dielectric layer, prior to depositing the source layer.

10. The method of claim 9, wherein the first capping layer comprises titanium nitride.

11. The method of claim 9, wherein depositing the source layer comprises depositing a tungsten layer using tungsten hexafluoride.

12. The method of claim 9, wherein the solid phase anneal process is performed at a temperature range between about 500° C. and about 700° C.

13. A method, comprising:

forming a semiconductor device comprising:

a first source/drain region;

a second source/drain region;

a channel region disposed between the first and second source/drain regions;

an interfacial layer formed on the channel region;

a high-K dielectric layer formed on the interfacial layer, wherein the high-K dielectric layer comprises fluorine at a molecular concentration in a range between about 18% and about 22%;

a gate electrode layer disposed over the high-K dielectric layer, wherein the gate electrode layer comprises aluminum;

a capping layer disposed between the high-K dielectric layer and the gate electrode layer; and a barrier layer disposed between the capping layer and the gate electrode layer.

14. The method of claim 13, wherein the channel region comprises two or more nanosheet channels.

15. The method of claim 1, wherein the first capping layer comprises a nitride and the second capping layer comprises silicon.

16. The method of claim 15, wherein the first anneal process is performed at a first temperature, the second anneal process is performed at a second temperature, and the first temperature is higher than the second temperature.

17. The method of claim 1, further comprising:

performing a flash anneal process after depositing the first capping layer and prior to depositing the second capping layer.

18. The method of claim 1, further comprising: prior to depositing the gate electrode layer, depositing a fourth capping layer over the high-K dielectric layer; and depositing a barrier layer over the fourth capping layer.

19. The method of claim 18, wherein the fourth capping layer comprises a lanthanum-based oxide layer.

20. The method of claim 19, wherein the gate electrode layer comprises aluminum.

* * * * *